United States Patent
Yoshimura et al.

(10) Patent No.: US 9,077,347 B2
(45) Date of Patent: Jul. 7, 2015

(54) OVEN CONTROLLED CRYSTAL OSCILLATOR

(71) Applicant: NIHON DEMPA KOGYO CO., LTD., Tokyo (JP)

(72) Inventors: Takahiro Yoshimura, Saitama (JP); Junichi Arai, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 13/933,131

(22) Filed: Jul. 2, 2013

(65) Prior Publication Data

US 2014/0009235 A1     Jan. 9, 2014

(30) Foreign Application Priority Data

Jul. 9, 2012   (JP) ................................. 2012-153269
May 10, 2013  (JP) ................................. 2013-100108

(51) Int. Cl.
    *H03L 1/04*    (2006.01)

(52) U.S. Cl.
    CPC ........................................ *H03L 1/04* (2013.01)

(58) Field of Classification Search
    USPC ............ 331/107 R, 116 R, 116 FE, 154, 158, 331/176, 185, 186
    See application file for complete search history.

(56) References Cited

U.S. PATENT DOCUMENTS

| 7,821,346 B2 * | 10/2010 | McCracken | ..................... 331/69 |
| 7,965,146 B2 * | 6/2011 | Ito | ..................... 331/70 |
| 8,013,683 B2 * | 9/2011 | Arai | ............................. 331/176 |
| 2006/0214743 A1 * | 9/2006 | Arai et al. | ..................... 331/176 |
| 2010/0289589 A1 * | 11/2010 | Ito et al. | ......................... 331/70 |

FOREIGN PATENT DOCUMENTS

JP    4739387    8/2011

* cited by examiner

*Primary Examiner* — Joseph Chang
*Assistant Examiner* — Jeffrey Shin
(74) *Attorney, Agent, or Firm* — Jianq Chyun IP Office

(57) ABSTRACT

An oven controlled crystal oscillator includes a crystal unit, a temperature control circuit, and a circuit board. The temperature control circuit is configured to control a temperature of the crystal unit. The crystal unit includes a flange that projects outward to an entire outer periphery in one end. The circuit board includes a depressed portion in which the flange is partially inserted. The temperature control circuit includes a power transistor, a thermistor as a temperature sensor, and a metal pattern. The power transistor becomes a heat source. The metal pattern commonly connects a ground terminal of the crystal unit, a collector of the power transistor, and a ground terminal of the thermistor. The crystal unit is positioned in a state where the flange is partially inserted in the depressed portion. The crystal unit is connected to the metal pattern.

6 Claims, 5 Drawing Sheets

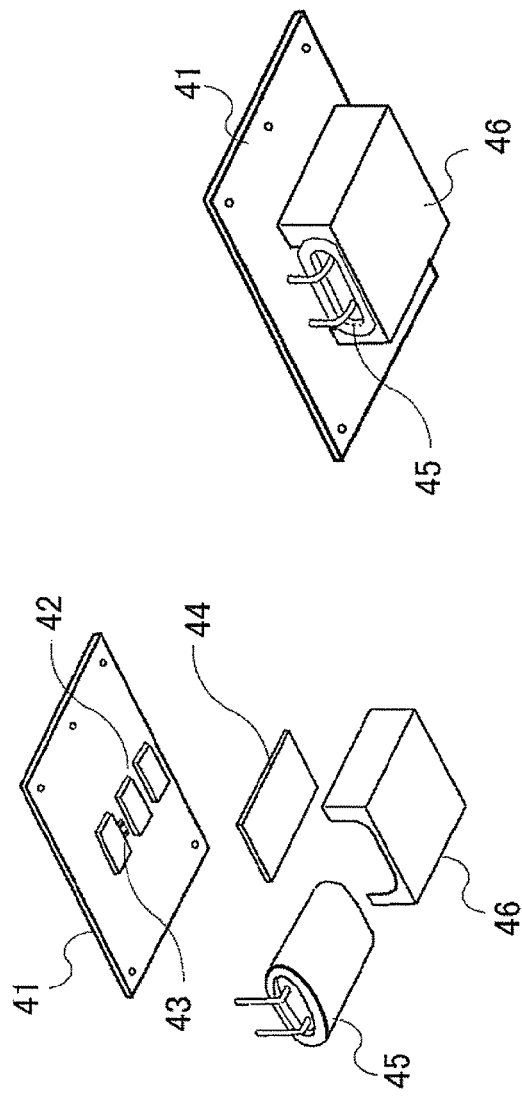

OVEN CONTROLLED CRYSTAL OSCILLATOR

CROSS REFERENCE TO RELATED APPLICATIONS

This application claims the priority benefit of Japan application serial no. 2012-153269, filed on Jul. 9, 2012, and Japan application serial no. 2013-100108, filed on May 10, 2013. The entirety of each of the above-mentioned patent applications is hereby incorporated by reference herein and made a part of this specification.

TECHNICAL FIELD

This disclosure relates to an Oven Controlled Crystal Oscillator (OCXO). Especially, this disclosure relates to the oven controlled crystal oscillator that ensures improved temperature stability while achieving a low profile. Further, this disclosure relates to the oven controlled crystal oscillator that allows mounting a crystal unit in a predetermined position during a solder reflow.

DESCRIPTION OF THE RELATED ART

Description of Related Art: FIGS. 4(a) and 4(b)

An oven controlled crystal oscillator maintains a constant operation temperature of a crystal unit. Thus, the oven controlled crystal oscillator does not cause a frequency variation depending on a frequency temperature characteristic. Also, a highly-stabilized oscillation frequency is obtained. A conventional oven controlled crystal oscillator will be described by referring to FIGS. 4(a) and 4(b). FIGS. 4(a) and 4(b) are schematic explanatory views illustrating a configuration of an oscillator used for the conventional oven controlled crystal oscillator. FIG. 4(a) illustrates an exploded explanatory view. FIG. 4(b) illustrates an external explanatory view. As illustrated in FIG. 4(a), on one surface of a circuit board 41 (here, inferior surface), the conventional oven controlled crystal oscillator includes a heat source 42, a temperature sensor 43, a heat radiation insulation sheet 44, a crystal unit 45, and a heat tube 46.

The heat source 42 is made of a transistor or a resistor body and releases heat. The temperature sensor 43 is made of a thermistor and detects a temperature of the crystal unit 45. The heat radiation insulation sheet 44 covers the heat source 42 and the temperature sensor 43 mounted on the circuit board 41. The heat radiation insulation sheet 44 is disposed among the heat tube 46, the heat source 42, and the temperature sensor 43, which will be described below.

The crystal unit 45 oscillates at a specific frequency. The crystal unit 45 is enclosed in a metallic casing. Two lead terminals project from the casing. The heat tube 46 is a metallic pipe that covers the entire crystal unit 45 except the lead terminal. The heat tube 46 efficiently conducts heat from the heat source 42 to the crystal unit 45. The heat tube 46 is, for example, made of an aluminum or similar material.

As illustrated in FIGS. 4(a) and 4(b), on one surface of the circuit board 41 in the conventional oven controlled crystal oscillator, the heat source 42 and the temperature sensor 43 are mounted, and the crystal unit 45, which is stored in the heat tube 46, is mounted via the heat radiation insulation sheet 44. The crystal unit 45 includes a lead terminal that passes through a metal base and is extracted on the other surface.

Although the illustration is omitted, the circuit board 41 (see FIG. 4(b)) where the respective electronic components are mounted is further stored in a metal cover, which includes a space of a depressed portion. The circuit board 41 is secured to the metal base, which covers an opening portion of the space of the depressed portion in the metal cover, by a pin. That is, the circuit board 41, on which the components are mounted, is stored in the space inside the metal cover, and is sealed by the metal base. This constitutes an oven controlled crystal oscillator. The space sealed by the metal cover and the metal base forms an oven.

Temperature Control Circuit of the Conventional Oven Controlled Crystal Oscillator: FIG. 5

A temperature control circuit used for the conventional oven controlled crystal oscillator will be described by referring to FIG. 5. FIG. 5 is a circuit diagram of the temperature control circuit of the conventional oven controlled crystal oscillator. As illustrated in FIG. 5, the temperature control circuit of the conventional oven controlled crystal oscillator includes basically a thermistor TH, a differential amplifier (OPAMP) IC10, a power transistor Tr1, and a heater resistance HR.

Connection Relationship

The heater resistance HR has one end to which a supply voltage DC is applied and the other end to which a collector of the power transistor Tr1 is connected. The power transistor Tr1 has an emitter grounded to ground (GND).

The supply voltage DC is also applied to one end of the thermistor TH. The other end of the thermistor TH is connected to one end of a resistance R1. The other end of the resistance R1 is grounded. The supply voltage DC is further applied to one end of a resistance R2. The other end of the resistance R2 is connected to one end of a resistance R3. The other end of the resistance R3 is grounded. The supply voltage DC is applied to the differential amplifier IC10 for driving (not shown). The differential amplifier IC10 is also connected to GND.

Then, a point between the other end of the thermistor TH and the one end of the resistance R1 is connected to one side of a terminal (−terminal) of the differential amplifier IC10 via a resistance R4. The other point between the other end of the resistance R2 and one end of the resistance R3 is connected to the other side of the terminal (+terminal) of the differential amplifier IC10. Further, an output terminal of the differential amplifier IC10 connects to the −terminal via a resistance R5. Then, the output terminal of the differential amplifier IC10 connects to the base of the power transistor Tr1.

Each Portion

The thermistor TH is a thermosensor where a resistance value varies depending on temperature. The thermistor TH detects the temperature of the crystal unit. The differential amplifier IC10 operates as follows. A voltage between the thermistor TH and the resistance R1 is inputted to one side of the input terminal (−terminal) via the resistance R4. Also, an output of the differential amplifier IC10 is inputted as feedback via the resistance R5. A voltage between the resistance R2 and the resistance R3 is inputted to the other side of the input terminal (+terminal). Thus, the differential amplifier IC10 amplifies the difference between the voltages of the two input terminals and then outputs.

The power transistor Tr1 is an NPN type transistor. The power transistor Tr1 includes a base that receives the output of the differential amplifier IC10. Corresponding to the base current, the power transistor Tr1 applies a current between the collector and the emitter so as to apply a current to the heater resistance HR. The heater resistance HR generates heat corresponding to the flowing current. Note that the power transistor Tr1 and the heater resistance HR are heat sources.

In the OCXO, if the heat source, a sensor of the thermistor TH, and the crystal unit were able to be integrated, the OCXO would ensure the increased temperature characteristic performance. However, in practice, the aforementioned three parts are not electrically connected. Thus, the aforementioned three parts are not physically connected. Hence, the three parts are disposed as close as possible and installed via an insulator such as the above-described heat radiation insulation sheet 44.

In the heat source, a collector terminal part of the power transistor Tr1 generates heat and constantly generates an electric potential. A base material of the heater resistance HR is a ceramic. A resistance film, which generates heat, is formed on the top surface, and this part generates heat. However, the heat sources of the power transistor Tr1 and the heater resistance HR are known to show a difference in the amount of heat generation depending on a change of the ambient temperature.

Cylindrical Crystal Unit: FIGS. 6(a) and 6(b)

As a crystal unit, which stabilizes frequency for long-term, there is a cylindrical crystal unit. The cylindrical crystal unit will be described by referring to FIGS. 6(a) and 6(b). FIGS. 6(a) and 6(b) are schematic external views of the cylindrical crystal unit. FIG. 6(a) is a top view of the cylindrical crystal unit. FIG. 6(b) is a side view of the cylindrical crystal unit. As illustrated in FIGS. 6(a) and 6(b), the cylindrical crystal unit has a following configuration. A base 51, which mounts a crystal blank, is covered by a metallic cover 52. A lead terminal 53 projects below from the base 51. A flange 54 and the base 51 are bonded by solder. The flange 54 corresponds to the peripheral portion of the cover 52. An entire portion where the flange 54 of a casing and the base 51 are bonded and projected outside from the crystal unit body may also be referred to as a flange.

In the case where the crystal unit of FIGS. 6(a) and 6(b) is used for the oven controlled crystal oscillator, the heat is required to be transferred to the crystal unit through a metal fitting and a heat radiation insulating material. These have smaller thermal conductivities than that of a metal such as copper. Hence, the heat is not efficiently transferred, and the temperature stability is reduced.

Related Technique

As a technique regarding the oven controlled crystal oscillator, Japanese Patent No. 4739387 discloses "oven controlled type crystal oscillator" (NIHON DEMPA KOGYO CO., LTD., hereinafter referred to as Patent Literature 1). In Patent Literature 1, the oven controlled crystal oscillator has a following configuration. The crystal unit is mounted on a circuit board by interposing a first heat conductive resin formed of a resin sheet. The crystal unit, a chip resistance, and a temperature element (temperature sensor) are thermally bonded by a second heat-conductive resin where a liquid resin is hardened.

However, the conventional oven controlled crystal oscillator has the following problems. Use of a heat tube makes reduction of a dimension in the height direction difficult. Without the heat tube, temperature stability is not sufficient. The conventional cylindrical crystal unit used for the oven controlled crystal oscillator has the following problem. In this case, the heat is not efficiently transferred, and temperature stability is low.

Further, in the case where the crystal unit is directly soldered on the board without the heat tube (reflow implement), this achieves a low profile. However, in the case where a lead type crystal unit is mounted in reflow, the solder flows during reflow. Thus, mounting position of the crystal unit is displaced, which is a problem.

In Patent Literature 1, the temperature control circuit having a following configuration is not disclosed. A collector of a transistor, which is a heat generating portion, a thermistor, and a cover of a crystal unit are connected to a GND layer of the board via a common metal pattern so as to efficiently transfer heat and improve temperature stability.

Thus, a need exists for an oven controlled crystal oscillator which is not susceptible to the drawback mentioned above

SUMMARY

In order to solve the problems of the aforementioned conventional examples, this disclosure is featured as follows. An oven controlled crystal oscillator includes a crystal unit, a temperature control circuit, and a circuit board. The temperature control circuit is configured to control a temperature of the crystal unit. The crystal unit and the temperature control circuit are mounted on the circuit board. The crystal unit includes a flange that projects outward to an entire outer periphery in one end. The circuit board includes a depressed portion in which the flange is partially inserted. The temperature control circuit includes a power transistor, a thermistor as a temperature sensor, and a metal pattern. The power transistor becomes a heat source. The metal pattern commonly connects a ground terminal of the crystal unit, a collector of the power transistor, and a ground terminal of the thermistor. The crystal unit is positioned in a state where the flange is partially inserted in the depressed portion. The crystal unit is connected to the metal pattern.

BRIEF DESCRIPTION OF THE DRAWINGS

The foregoing and additional features and characteristics of this disclosure will become more apparent from the following detailed description considered with reference to the accompanying drawings, wherein:

FIG. 1(a) is an exploded explanatory view, and FIG. 1(b) is an external explanatory view;

FIG. 3(a) is an external explanatory view, and FIG. 3(b) is a partial explanatory view;

FIGS. 4(a) and 4(b) are schematic explanatory views illustrating a configuration of an oscillator used for a conventional oven controlled crystal oscillator, FIG. 4(a) is an exploded explanatory view, and FIG. 4(b) is an external explanatory view;

FIG. 6(a) is a top view, and FIG. 6(b) is a side view.

DETAILED DESCRIPTION

An embodiment of this disclosure will be explained with reference to the attached drawings.

Outline of Embodiment

The oven controlled crystal oscillator according to an embodiment of this disclosure is configured as follows. As a temperature control circuit, a collector side of a PNP type power transistor and one end of a thermistor are connected to ground level using a common metal pattern. The PNP type current limiting transistor limits a current flowing through a heater resistance connected to the emitter of the power transistor. A circuit with the PNP type current limiting transistor is used to directly mount the crystal unit on the common pattern of the board by soldering. A flange of a casing is partially inserted in a slit formed on the board. The heat from the collector of the power transistor is efficiently conducted to the crystal unit and the thermistor, which are commonly connected. Although a heat tube is not used, thermal responsiveness and temperature stability can be improved. This achieves a low profile and providing an oscillator with an excellent temperature characteristic. Further, when mounting the crystal unit in a solder reflow, this prevents movement of the crystal unit. This consequently allows the crystal unit to be mounted in a predetermined mounting position.

The oven controlled crystal oscillator according this disclosure is configured as follows. The cylindrical crystal unit and the aforementioned temperature control circuit are used. On the board, a depressed portion is formed in the region where the crystal unit is mounted. The outer peripheral portion of the depressed portion and a flange backside surface of the crystal unit are soldered. The crystal unit, the collector side of the power transistor, and the thermistor are connected using the common pattern. The heat from the collector of the power transistor is efficiently conducted to the crystal unit and the thermistor, which are commonly connected. The thermal responsiveness and the temperature stability can be improved. This can prevent the lead terminal and the GND terminal of the crystal unit from connecting by soldering.

First Embodiment

Figures 1A, 1B:
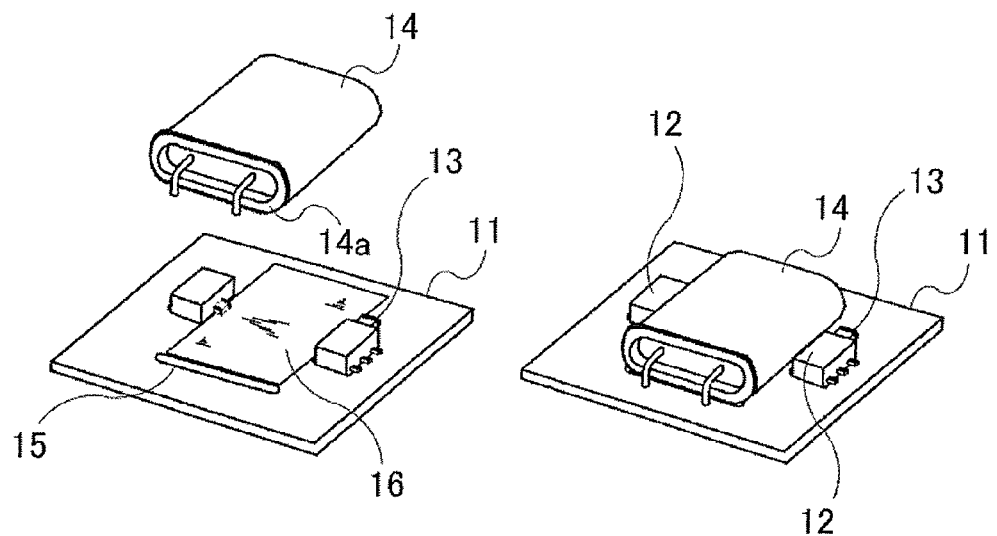
FIGS. 1(a) and 1(b) are schematic explanatory views illustrating a configuration of an oscillator used for an oven controlled crystal oscillator according to a first embodiment of this disclosure.

FIGS. 1(a) and 1(b)

A configuration of an oven controlled crystal oscillator according to a first embodiment of this disclosure will be described by referring to FIGS. 1(a) and 1(b). FIGS. 1(a) and 1(b) are schematic explanatory views illustrating a configuration of an oscillator used for the oven controlled crystal oscillator according to the first embodiment of this disclosure. FIG. 1(a) is an exploded explanatory view. FIG. 1(b) is an external explanatory view. As illustrated in FIGS. 1(a) and 1(b), the oscillator of the oven controlled crystal oscillator (first oven controlled crystal oscillator) according to the first embodiment of this disclosure includes a heat source 12, a thermistor 13, and a crystal unit 14 on one surface of a circuit board 11.

Figure 5:
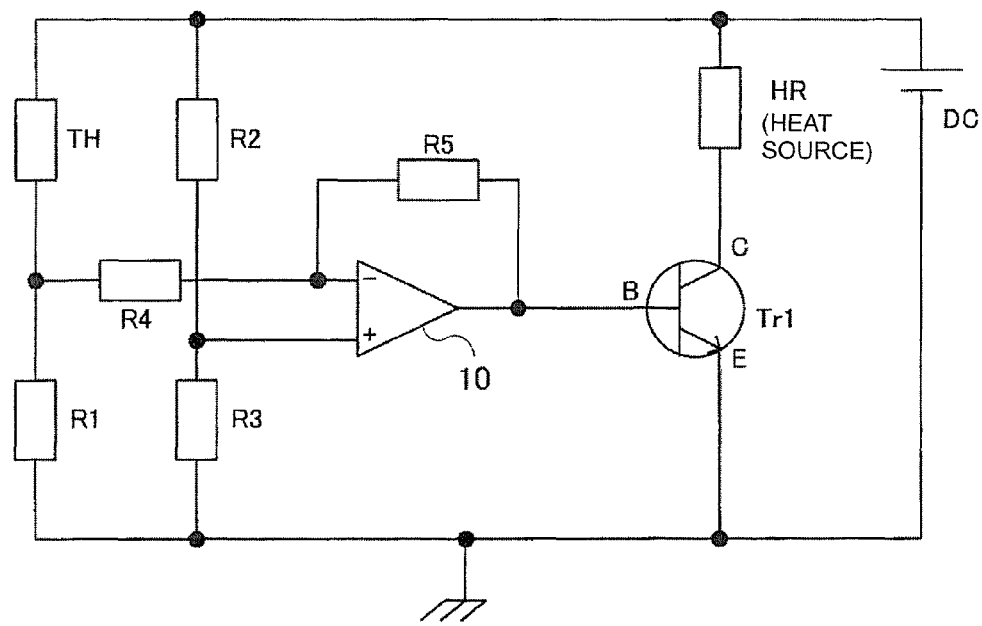
FIG. 5 is a circuit diagram of a temperature control circuit of a conventional oven controlled crystal oscillator.

That is, the first oven controlled crystal oscillator is configured as follows. The first oven controlled crystal oscillator does not include the heat radiation insulation sheet 44 and the heat tube 46 used for the conventional oven controlled crystal oscillator illustrated in FIG. 5. The crystal unit 14 is directly mounted on the circuit board 11 by soldering. Here, the crystal unit 14 is mounted on the circuit board 11 using a solder reflow. Eliminating the heat tube 46 allows reducing the dimensions in the height direction. Further, this makes the heat radiation insulation sheet 44 with a low thermal conductivity unnecessary for the first oven controlled crystal oscillator. Instead, interposing the metal pattern allows efficient conduction of heat and improved temperature stability.

Then, as illustrated in FIG. 1(b), the circuit board 11, on which electronic components are mounted, is stored in a depressed portion of a metal cover (not shown), and is secured to a metal base by a pin and sealed. The metal base covers an opening portion of the depressed portion in the metal cover. This forms the first oven controlled crystal oscillator. The metal cover and the metal base seal a space to form an oven. In the first oven controlled crystal oscillator, the circuit board 11 is stored in the metal cover such that the surface where the crystal unit 14 and the heat source 12 are mounted faces the metal base.

[Each Portion]

Each portion in the first oven controlled crystal oscillator will be described. In the first oven controlled crystal oscillator, the PNP power transistor is used as the heat source 12. FIGS. 1(a) and 1(b) illustrate a configuration that includes two PNP power transistors acting as the heat source 12. The thermistor 13 is a temperature sensor that detects a temperature of the crystal unit 14.

The crystal unit 14 is configured as follows. A crystal blank, which is installed in the base, is enclosed in a metallic casing. Two lead terminals project from the metallic casing. In the casing of the crystal unit 14, a flange 14a in a shape of an edge (boarder or brim) projected outside is disposed at the entire outer periphery of the side of the projected leads. Then, the crystal unit 14 is directly bonded to a metal pattern 16 by soldering where one surface of the cover (corresponding to the GND terminal) is formed on the circuit board 11 and grounded.

[Slit 15]

The first oven controlled crystal oscillator is featured as follows. The circuit board 11 includes a slit 15 where the flange 14a of the crystal unit 14 is partially inserted (In the example of FIGS. 1(a) and 1(b), an edge of the lower side of the flange 14a). The slit 15 is disposed on the circuit board 11. Hence, in the case where the crystal unit 14 is mounted on the circuit board 11, the flange 14a is partially fit in the slit 15. One surface of the cover, which becomes the GND terminal of the crystal unit 14, is in close contact with the circuit board 11. This allows promoting the conduction of the heat and achieving a low profile.

Further, the slit 15 secures the crystal unit 14 in a predetermined position. In the case where the crystal unit 14 is mounted on the circuit board 11 at the correct position, the slit 15 is formed so that the flange 14a is partially inserted in the slit 15. That is, the crystal unit 14 is positioned in the predetermined position by partially inserting the flange 14a in the slit 15.

Specifically, when mounting the crystal unit 14 on the circuit board 11 by solder reflow, even if the solder between the circuit board 11 and the crystal unit 14 flows by reflow, the flange 14a is partially inserted in the slit 15. Thus, the position of the crystal unit 14 can be fixed in the predetermined position that was determined in advance. This prevents the position displacement of the crystal unit 14, thus mounting in the proper position. The provided slit 15 releases the heat outside when the crystal unit 14 is overheated.

Instead of the slit 15, in the position corresponding to the flange 14a of the circuit board 11, a depressed portion (groove or counter boring) may be disposed. The depressed portion includes an opening portion similar to the slit 15 and does not pass through the circuit board 11. In the case where a counter boring is disposed, the flange 14a is partially inserted in the counter boring. Thus, this allows securing the crystal unit 14 such that the crystal unit 14 is not displaced from the predetermined position during reflow.

[Metal Pattern 16]

Then, forming a temperature control circuit as described below configures the first oven controlled crystal oscillator as follows. The GND terminal of the crystal unit 14, the collector of the power transistor, which is the heat source 12, and the GND terminal of the thermistor 13 are electrically connected by the common metal pattern 16 formed on the circuit board 11.

The metal pattern 16 is formed by a metal such as a copper and has excellent thermal conductivity. Hence, this allows conduction of heat from the heat source 12 to the crystal unit 14 and the thermistor 13 with no loss of heat. The metal pattern 16 thermally bonds the crystal unit 14, the heat source 12, and the thermistor 13 together. Further, the flange 14a of the crystal unit 14 is partially inserted in the slit 15. Thus, the area where the crystal unit 14 closely contacts the GND pattern becomes larger, thus further improving the conduction of the heat.

[Comparison of Thermal Conductivities]

Conventionally, the heat radiation insulation sheet disposed between the crystal unit and the heat source has a significantly low thermal conductivity of 6.5 W/(m·K). An aluminum, which is a typical material of the heat tube used for the conventional oven controlled crystal oscillator, has a thermal conductivity of 237 W/(m·K). In contrast to this, a copper, which is used for the common GND pattern, has an good thermal conductivity of 398 W/(m·K).

In the first oven controlled crystal oscillator, the heat radiation insulation sheet is not used. The crystal unit 14 and the heat source 12 are in contact only via the metal pattern 16, which is the common GND pattern formed by the copper. Hence, it becomes significantly easier to transfer heat compared with the conventional one. This improves the temperature stability.

Further, the first oven controlled crystal oscillator does not include the heat tube. Hence, the heat capacity of the entire oscillator is lower compared with the conventional one. Thus, this allows shortening the time that the crystal unit 14 reaches a constant temperature until the crystal unit 14 is in a stable temperature state at the time of startup of the oscillator. Therefore, in the first oven controlled crystal oscillator, the thermal conductivity is increased compared with the conventional one, and the heat capacity is reduced. This allows shortening the time until the stabilization of the frequency at the time of startup. This also improves the subsequent temperature stability.

[Low Profiling]

The first oven controlled crystal oscillator eliminates the need for the heat tube, which is conventionally used as a means for conducting the heat efficiently. The flange 14a of the crystal unit 14 is inserted in the slit 15 or the counter boring, which is disposed in the first oven controlled crystal oscillator. This reduces the dimensions in the height direction of the entire oscillator, thus achieving low profile.

[Arrangement on the Circuit Board 11: FIGS. 1(*a*) and 1(*b*)]

Next, the arrangement on the circuit board 11 of the first oven controlled crystal oscillator will be described by referring to FIGS. 1(*a*) and 1(*b*). As illustrated in FIGS. 1(*a*) and 1(*b*), the crystal unit 14 is mounted on one surface of the circuit board 11 (here, top surface) such that the flange 14a of the crystal unit 14 is fit in the slit 15. The lead terminal is extracted to the other surface via a through hole formed on the circuit board 11.

The PNP power transistor, which is the heat source 12, is disposed in close contact or adjacently just beside the crystal unit 14. The thermistor 13 is also disposed in close contact or adjacently just beside the crystal unit 14 and the heat source 12. As described above, the crystal unit 14, the heat source 12, and the thermistor 13 are connected to the common metal pattern 16 on the circuit board 11. Thus, the distances among the crystal unit 14, the heat source 12, and the thermistor 13 are set to be the shortest. This allows transferring the heat efficiently and enhancing the temperature stability. In FIGS. 1(*a*) and 1(*b*), the two PNP power transistors are used to further enhance temperature stability.

Figure 2:
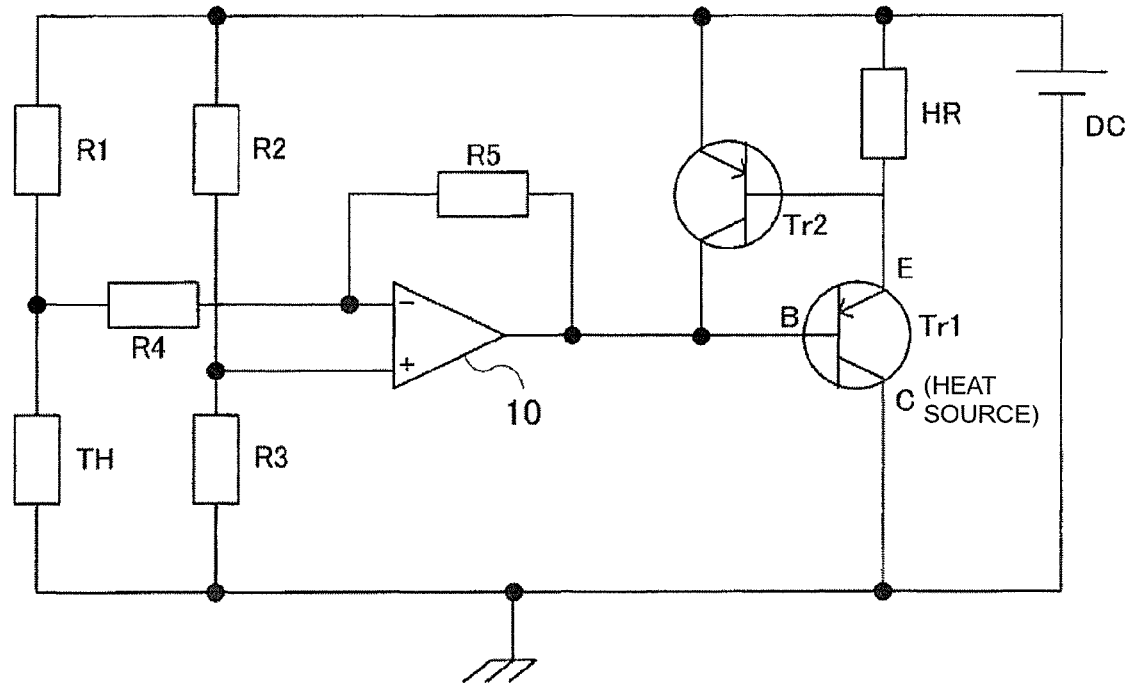
FIG. 2 is a circuit diagram of a temperature control circuit according to the embodiments of this disclosure.

[Temperature Control Circuit: FIG. 2]

Next, the temperature control circuit of the oven controlled crystal oscillator according to the embodiment of this disclosure will be described by referring to FIG. 2. FIG. 2 is a circuit diagram of the temperature control circuit according to the embodiment of this disclosure. The temperature control circuit of FIG. 2 is used for the first oven controlled crystal oscillator and a second oven controlled crystal oscillator described below. The temperature control circuit of the oven controlled crystal oscillator according to the embodiment of this disclosure (this temperature control circuit) controls the temperature of the oven. As a result, the temperature control circuit controls the temperature of the crystal unit. This temperature control circuit, as illustrated in FIG. 2, basically, includes a thermistor TH, a differential amplifier (OPAMP) IC10, a power transistor Tr1, a heater resistance HR, and a current limiting transistor Tr2. Then, the power transistor Tr1 and the current limiting transistor Tr2 are PNP type transistors.

[Connection Relationship in the Temperature Control Circuit]

A supply voltage DC is applied to one end of the heater resistance HR. The emitter of the power transistor Tr1 is connected to the other end of the heater resistance HR. The collector of the power transistor Tr1 is grounded to a ground (GND).

The supply voltage DC is also applied to one end of a resistance R1. The other end of the resistance R1 is connected to one end of the thermistor TH. The other end of the thermistor TH is grounded to the GND. The supply voltage DC is also applied to one end of a resistance R2. The other end of the resistance R2 is connected to one end of a resistance R3. The other end of the resistance R3 is grounded to GND.

Then, a point between the other end of the resistance R1 and the one end of the thermistor TH is connected to one side of an input terminal (−terminal) of the differential amplifier IC10 via a resistance R4. A point between the other end of the resistance R2 and one end of the resistance R3 is connected to the other side of the input terminal (+terminal) of the differential amplifier IC10. Also, an output terminal and an input terminal (−terminal) of the differential amplifier IC10 are connected as feedback via a resistance R5. Then, the output terminal of the differential amplifier IC10 is connected to the base of the power transistor Tr1. The supply voltage DC is applied to the differential amplifier IC10 for driving, and the differential amplifier IC10 is connected to GND (not shown).

The supply voltage DC is also applied to the emitter of the current limiting transistor Tr2. The point between the other end of the heater resistance HR and the emitter of the power transistor Tr1 are connected to the base of the current limiting transistor Tr2. The collector of the current limiting transistor Tr2 is connected to the base of the power transistor Tr1.

[Each Portion of the Temperature Control Circuit]

[Thermistor TH]

The thermistor TH is a temperature sensor where a resistance value varies depending on temperature. The thermistor TH detects the operation temperature of the crystal unit 14. This temperature control circuit is featured as follows. The other end of the thermistor TH is connected to a common GND layer with the collector of the power transistor Tr1 at ground level.

That is, the other end of the thermistor TH and the collector of the power transistor Tr1 can be physically and electrically connected via the GND layer formed by the copper with good thermal conductivity. Thus, this improves the thermal responsiveness.

[Differential Amplifier IC10]

The differential amplifier IC10 operates as follows. A voltage between the resistance R1 and the thermistor TH is inputted to one side of the input terminal (−terminal) via the resistance R4. Also, an output of the differential amplifier IC10 is inputted as feedback via the resistance R5. A voltage between the resistance R2 and the resistance R3 is inputted to the other side of the input terminal (+terminal). Thus, the differential amplifier IC10 amplifies the difference between the voltages of the two input terminals and then outputs.

[Power Transistor Tr1]

The power transistor Tr1 is a PNP type transistor. The output of the differential amplifier IC10 is inputted to the base. Corresponding to the voltage applied to the base, the power transistor Tr1 applies a current between the emitter and the collector so as to apply the current to the heater resistance HR as well. The power transistor Tr1 limits the current flowing through the heater resistance HR by operation of the current limiting transistor Tr2. Thus, the heater resistance HR is not a heat source, and the power transistor Tr1 alone becomes a heat source. Especially, the collector of the power transistor Tr1 (GND side) generates heat. The power transistor Tr1 may be constituted by a P-channel MOSFET.

[Heater Resistance HR]

The supply voltage DC is also applied to the heater resistance HR. The heater resistance HR generates heat corresponding to the current flowing by operation of the power transistor Tr1. However, in the heater resistance HR, the flowing current is limited by operation of the current limiting transistor Tr2. Thus, the heater resistance HR does not become a heat source compared with the conventional temperature control circuit without a current limiting circuit. The examples of FIGS. 1(a) and 1(b) illustrate the power transistor Tr1 and the current limiting transistor Tr2 as the heat source 12.

[Current Limiting Transistor Tr2]

The current limiting transistor Tr2 operates as follows. A voltage at a point on a line connecting the other end of the heater resistance HR and the emitter of the power transistor Tr1 is applied to the base of the current limiting transistor Tr2. Corresponding to the applied voltage, the current limiting transistor Tr2 controls the current flows through the emitter, which is connected to the supply voltage DC, and the collector, which is connected to the base of the power transistor Tr1.

That is, depending on the current flowing through the emitter of the power transistor Tr1, the voltage applied to the base of the current limiting transistor Tr2 is variable. The current flowing through the emitter and the collector of the current limiting transistor Tr2 is also variable.

Specifically, when the current that is flowing through the emitter of the power transistor Tr1 increases, the maximum current is determined by the current limiting transistor Tr2 and a current detecting resistor. The amount of heat generation in the heater resistance HR is limited. The current is mainly consumed in the power transistor Tr1. When the current flowing through the emitter of the power transistor Tr1 decreases, the current that flows through the emitter and the collector of the current limiting transistor Tr2 also decreases. Thus, the current limiting transistor Tr2 stops operating.

Effect of First Embodiment

With the oven controlled crystal oscillator according to the first embodiment of this disclosure, the oven controlled crystal oscillator has the following effects. As the temperature control circuit, the collector side of the PNP type power transistor Tr1, which is the heat source 12, and one end of the thermistor 13 are connected to the common GND pattern (the metal pattern 16), which is formed by a copper. The PNP type current limiting transistor Tr2 limits the current flowing through the heater resistance HR to which the emitter of the power transistor Tr1 is connected. A circuit with the PNP type current limiting transistor Tr2 is used. The slit 15 is disposed on the circuit board 11. In a state where the flange 14a of the crystal unit 14 is inserted in the slit 15, the casing (GND terminal) of the crystal unit 14 is directly soldered and mounted on the above-described common GND pattern. The heat source is made by the power transistor Tr1 alone, thus preventing heat dispersion. The heat from the collector of the power transistor Tr1 is efficiently conducted to the crystal unit 14 and the thermistor 13 by the metal pattern 16 made of a copper with a high thermal conductivity. Without using a heat tube, the thermal responsiveness and the temperature stability can be improved. This achieves an oscillator with an excellent temperature characteristic and low profile. Further, the flange 14a is partially inserted in the slit 15 or the counter boring. Thus, the crystal unit 14 is secured in the predetermined position on the circuit board 11. This can prevent the position of the crystal unit 14 to be displaced during solder reflow.

Second Embodiment

Figures 3A, 3B:
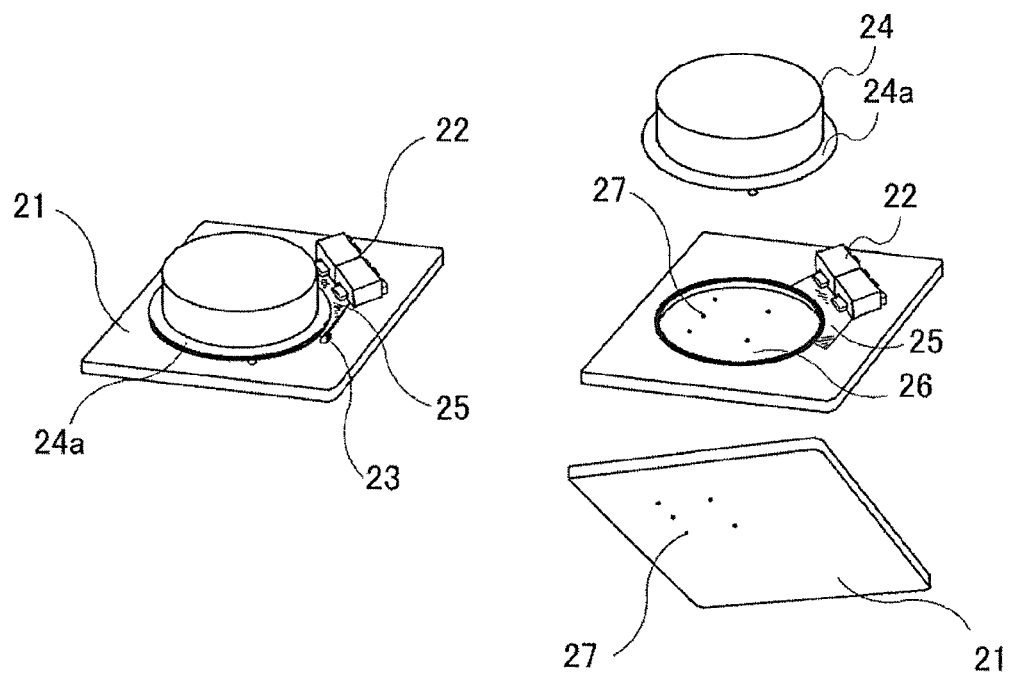
FIGS. 3(a) and 3(b) are schematic explanatory views illustrating a configuration of an oscillator used for an oven controlled crystal oscillator according to a second embodiment of this disclosure.

FIGS. 3(a) and 3(b)

Next, a configuration of an oven controlled crystal oscillator according to a second embodiment of this disclosure will be described by referring to FIGS. 3(a) and 3(b). FIGS. 3(a) and 3(b) are schematic explanatory views illustrating a configuration of the oscillator used for the oven controlled crystal oscillator according to the second embodiment of this disclosure. FIG. 3(a) is an external explanatory view. FIG. 3(b) is a partial explanatory view. The oven controlled crystal oscillator (the second oven controlled crystal oscillator) according to the second embodiment of this disclosure includes a cylindrical crystal unit illustrated in FIGS. 6(a) and 6(b) and the temperature control circuit illustrated in FIG. 2. As described above, the cylindrical crystal unit has a stable frequency characteristic for long-term. Further, the second oven controlled crystal oscillator achieves the oven controlled crystal oscillator with a further improved temperature stability.

Figure 6A:
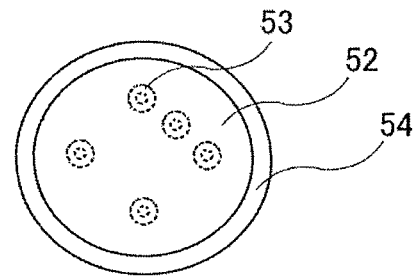
FIGS. 6(a) and 6(b) are schematic external views of a cylindrical crystal unit.
Figure 6B:
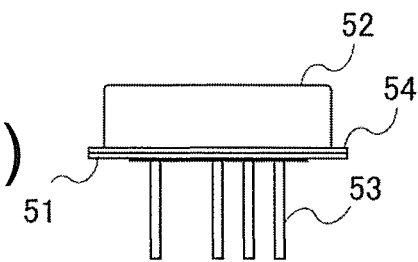

As illustrated in FIG. 3(a), an oscillator in the second oven controlled crystal oscillator is configured as follows. On one surface (here, top surface) of a circuit board 21, a heat source 22, a thermistor 23, and a cylindrical crystal unit 24 illustrated in FIGS. 6(a) and 6(b) are mounted. The crystal unit 24 includes an outer periphery of inferior surface where a flange 24a is formed to project outside. Here, the entire part where a base and a casing are bonded and are projected outside is referred to as a flange. While a PNP power transistor is used as the heat source 22, a P-channel MOSFET may be used. Here, the oscillator includes two heat sources 22 so as to further enhance the temperature stability.

In the second oven controlled crystal oscillator, the above-described temperature control circuit illustrated in FIG. 2 is used. The temperature control circuit is configured as follows. The base, the heat source 22, and the thermistor 23 are connected to a common metal pattern 25, and are grounded. The base corresponds to the back side of the flange 24a of the crystal unit 24. The metal pattern 25 is formed of a copper or similar material and has a high thermal conductivity. Therefore, the heat from the collector of the PNP power transistor Tr1 of the heat source 22 is efficiently conducted to the thermistor 23 and the crystal unit 24 so as to improve the temperature stability. Then, the oscillator of FIG. 3(a) is stored in a depressed portion of a metal cover. The oscillator is secured to a metal base, which covers the depressed portion, by a pin, and is sealed. This constitutes the second oven controlled crystal oscillator.

The second oven controlled crystal oscillator is featured as follows. As illustrated in FIG. 3(b), on top surface of the circuit board 21, a depressed portion (counter boring) 26 is formed in the part where the crystal unit 24 is to be mounted. The depressed portion 26 includes a smaller opening portion compared with the flange 24a of the crystal unit 24. On the circuit board 21, the metal pattern 25 is formed. The metal pattern 25 connects commonly the crystal unit 24, the PNP power transistor Tr1, and the thermistor 23, and is grounded. Then, on the bottom surface of the depressed portion 26, through holes 27 are formed. The lead terminal of the crystal unit 24 passes through the through hole 27. The lead terminal is configured to be extracted to the back side of the circuit board 21.

Further, in the second oven controlled crystal oscillator, an annular soldering pattern 26a (shown as black-painted) is formed in the outer periphery of the opening portion of the depressed portion 26. That is, the depressed portion 26 is formed inside of the soldering pattern 26a. The soldering pattern 26a is connected to the metal pattern 25. This electrically connects the heat source 22, the thermistor 23, and the crystal unit 24 to the common metal pattern 25 and thermally bonds them together.

Then, when mounting the crystal unit 24 on the circuit board 21, only the backside surface (here, inferior surface) of the base corresponding to the back side of the flange 24a is soldered. This bonds the outer peripheral portion of the back surface of the base to the soldering pattern 26a formed in the outer periphery portion of the depressed portion 26 on the circuit board 21. Here, in the case where the entire back surface of the base of the crystal unit 24 is soldered, there is a possibility that the base and the lead of the crystal unit 24 are connected by solder. However, disposing the depressed portion 26 on the circuit board 21 provides a space, and the outer peripheral portion of the depressed portion 26 and the inferior surface of the flange 24a of the crystal unit 24 are soldered. This keeps the lead terminal out of the solder and prevents the base part, which connects to GND, from connecting to the lead.

Effect of Second Embodiment

With the oven controlled crystal oscillator according to the second embodiment of this disclosure, the oven controlled crystal oscillator has the following effects. As the temperature control circuit, the collector side of the PNP type power transistor Tr1, which is the heat source 22, and one end of the thermistor 23 are connected to the common metal pattern 25, which is formed by a copper, and grounded. The PNP type current limiting transistor Tr2 limits the current flowing through the heater resistance HR to which the emitter of the power transistor Tr1 is connected. A circuit with the PNP type current limiting transistor Tr2 is used to commonly connect the back surface of the flange 24a of the cylindrical crystal unit 24, the heat source 22, and the thermistor 23 to the metal pattern 25 of the circuit board 21. Thus, the heat from the heat source 22 is efficiently conducted to the thermistor 23 and the crystal unit 24 so as to improve the thermal responsiveness and the temperature stability. This achieves an oscillator with a good frequency characteristic and an excellent temperature characteristic for long-term.

According to the second oven controlled crystal oscillator, the second oven controlled crystal oscillator is configured as follows. On the circuit board 21, the depressed portion 26 is formed in the part where the crystal unit 24 is to be mounted. The depressed portion 26 is smaller than the outer periphery of the crystal unit 24. The back surface of the flange 24a of the crystal unit 24 and the soldering pattern 26a, which is formed at the outer periphery of the depressed portion 26, are soldered. Thus, the inside parts other than the outer periphery on the back surface of the base of the crystal unit 24 is kept out from soldering. This prevents the connection between the base and the lead by soldering.

This disclosure improves the temperature stability while achieving a low profile. Further, this disclosure is suitable for the oven controlled crystal oscillator that allows mounting a crystal unit in a predetermined position during a solder reflow.

The aforementioned oven controlled crystal oscillator of this disclosure may be featured as follows. The temperature control circuit includes a heater resistance, a thermistor, a differential amplifier, a PNP type power transistor, and a PNP type current limiting transistor. The heater resistance has one end. A supply voltage is supplied to the one end of the being to generate heat. The thermistor has one end and another end. The supply voltage is supplied to the one end of the thermistor, the other end of the thermistor is grounded. The thermistor is a temperature sensor with a variable resistance value depending on temperature. The thermistor outputs a voltage corresponding to the temperature to the one end. The differential amplifier is configured to: receive a voltage between the supply voltage and the one end of the thermistor at one input terminal of the differential amplifier; receive a voltage of a signal line disposed in parallel in the thermistor at another input terminal of the differential amplifier; and amplify a difference between the voltage input to the other input terminal and the voltage input to the one input terminal to output as a control voltage. The output of the differential amplifier is inputted to the one input terminal as feedback via a resistance. The PNP type power transistor includes: an emitter to which the other end of the heater resistance is connected; a base that receives the output of the differential amplifier; and a collector that is grounded. The PNP type current limiting transistor includes: an emitter that receives the supply voltage; a base that receives the voltage between the other end of the heater resistance and the emitter of the power transistor; and a collector connected to the base of the power transistor. The collector of the power transistor and the other end of the thermistor are connected and grounded by a metal pattern that commonly connect.

The aforementioned oven controlled crystal oscillator of this disclosure is featured as follows. The depressed portion is a slit that passes through the circuit board.

The aforementioned oven controlled crystal oscillator of this disclosure is featured as follows. The depressed portion is a groove that does not pass through the circuit board.

In order to solve the problems of the aforementioned conventional examples, this disclosure is featured as follows. The oven controlled crystal oscillator includes a cylindrical crystal unit, a temperature control circuit, and a circuit board. The temperature control circuit is configured to control a temperature of the crystal unit. The crystal unit and the temperature control circuit are mounted on the circuit board. The crystal unit includes a flange that projects outward to an entire outer periphery on a surface bonded on the circuit board. The flange is connected to a ground terminal of the crystal unit. The circuit board includes a depressed portion formed in a part where the crystal unit is mounted and a soldering pattern that connects the crystal unit around the depressed portion. The temperature control circuit includes a power transistor, a thermistor as a temperature sensor, and a metal pattern. The power transistor becomes a heat source. The metal pattern connects commonly a ground terminal of the crystal unit, a collector of the power transistor, and a ground terminal of the thermistor. The ground terminal of the crystal unit is soldered to the soldering pattern of the circuit board and connected to the metal pattern.

The aforementioned oven controlled crystal oscillator of this disclosure is featured as follows. The temperature control circuit includes a heater resistance, a thermistor, a differential amplifier, a PNP type power transistor, and a PNP type current limiting transistor. The heater resistance has one end. A supply voltage is supplied to the one end of the being to generate heat. The thermistor has one end and another end. The supply voltage is supplied to the one end of the thermistor, the other end of the thermistor is grounded. The thermistor is a temperature sensor with a variable resistance value depending on temperature. The thermistor outputs a voltage corresponding to the temperature to the one end. The differential amplifier is configured to: receive a voltage between the supply voltage and the one end of the thermistor at one input terminal of the differential amplifier; receive a voltage of a signal line disposed in parallel in the thermistor at another input terminal of the differential amplifier; and amplify a difference between the voltage input to the other input terminal and the voltage input to the one input terminal to output as a control voltage. The output of the differential amplifier is inputted to the one input terminal as feedback via a resistance. The PNP type power transistor includes: an emitter to which the other end of the heater resistance is connected; a base that receives the output of the differential amplifier; and a collector that is grounded. The PNP type current limiting transistor includes: an emitter that receives the supply voltage; a base that receives the voltage between the other end of the heater resistance and the emitter of the power transistor; and a collector connected to the base of the power transistor. The collector of the power transistor and the other end of the thermistor are connected and grounded by a metal pattern that commonly connect.

The aforementioned oven controlled crystal oscillator of this disclosure may include a P-channel MOSFET instead of the power transistor.

According to the disclosure, the oven controlled crystal oscillator includes a crystal unit, a temperature control circuit, and a circuit board. The temperature control circuit is configured to control a temperature of the crystal unit. The crystal unit and the temperature control circuit are mounted on the circuit board. The crystal unit includes a flange that projects outward to an entire outer periphery in one end. The circuit board includes a depressed portion in which the flange is partially inserted. The temperature control circuit includes a power transistor, a thermistor as a temperature sensor, and a metal pattern. The power transistor becomes a heat source. The metal pattern commonly connects a ground terminal of the crystal unit, a collector of the power transistor, and a ground terminal of the thermistor. The crystal unit is positioned in a state where the flange is partially inserted in the depressed portion. The crystal unit is connected to the metal pattern. Thus, the heat from the power transistor, which becomes a heat source, can be efficiently conducted to the crystal unit and the thermistor via a metal pattern with a high thermal conductivity. Even without a heat tube, this disclosure improves thermal responsiveness and temperature stability. This provides an oscillator with an excellent temperature characteristic and achieves a low profile. Further, although solder flows during solder reflow, this consequently allows the crystal unit to be secured and mounted in a predetermined position.

According to the disclosure, the temperature control circuit includes a heater resistance, a thermistor, a differential amplifier, a PNP type power transistor, and a PNP type current limiting transistor. The heater resistance has one end. A supply voltage is supplied to the one end of the being to generate heat. The thermistor has one end and another end. The supply voltage is supplied to the one end of the thermistor, the other end of the thermistor is grounded. The thermistor is a temperature sensor with a variable resistance value depending on temperature. The thermistor outputs a voltage corresponding to the temperature to the one end. The differential amplifier is configured to: receive a voltage between the supply voltage and the one end of the thermistor at one input terminal of the differential amplifier; receive a voltage of a signal line disposed in parallel in the thermistor at another input terminal of the differential amplifier; and amplify a difference between the voltage input to the other input terminal and the voltage input to the one input terminal to output as a control voltage. The output of the differential amplifier is inputted to the one input terminal as feedback via a resistance. The PNP type power transistor includes: an emitter to which the other end of the heater resistance is connected; a base that receives the output of the differential amplifier; and a collector that is grounded. The PNP type current limiting transistor includes: an emitter that receives the supply voltage; a base that receives the voltage between the other end of the heater resistance and the emitter of the power transistor; and a collector connected to the base of the power transistor. The collector of the power transistor and the other end of the thermistor are connected and grounded by a metal pattern that commonly connect. Thus, this allows connecting the ground terminal of the crystal unit and the ground terminals of the power transistor and the thermistor to the common metal pattern so as to conduct efficiently the heat from the power transistor and improves thermal responsiveness and temperature stability. This achieves an oscillator with an excellent temperature characteristic.

According to the disclosure, an oven controlled crystal oscillator includes a cylindrical crystal unit, a temperature control circuit, and a circuit board. The temperature control circuit is configured to control a temperature of the crystal unit. The crystal unit and the temperature control circuit are mounted on the circuit board. The crystal unit includes a flange that projects outward to an entire outer periphery on a surface bonded on the circuit board. The flange is connected to a ground terminal of the crystal unit. The circuit board includes a depressed portion formed in a part where the crystal unit is mounted and a soldering pattern that connects the crystal unit around the depressed portion. The temperature control circuit includes a power transistor, a thermistor as a temperature sensor, and a metal pattern. The power transistor becomes a heat source. The metal pattern connects commonly a ground terminal of the crystal unit, a collector of the power transistor, and a ground terminal of the thermistor. The ground terminal of the crystal unit is soldered to the soldering pattern of the circuit board and connected to the metal pattern. Thus, the heat from the power transistor, which becomes a heat source, is efficiently conducted to the crystal unit and the thermistor via a metal pattern with a high thermal conductivity so as improve thermal responsiveness and temperature stability. This allows providing an oscillator with a good frequency characteristic and an excellent temperature characteristic for long-term. Further, the center portion on the bottom surface of the crystal unit where the lead terminal is disposed is kept out from soldering. This prevents the lead terminal and the ground terminal from connecting.

According to the disclosure, the temperature control circuit includes a heater resistance, a thermistor, a differential amplifier, a PNP type power transistor, and a PNP type current limiting transistor. The heater resistance has one end. A supply voltage is supplied to the one end of the being to generate heat. The thermistor has one end and another end. The supply voltage is supplied to the one end of the thermistor, the other end of the thermistor is grounded. The thermistor is a temperature sensor with a variable resistance value depending on temperature. The thermistor outputs a voltage corresponding to the temperature to the one end. The differential amplifier is configured to: receive a voltage between the supply voltage and the one end of the thermistor at one input terminal of the differential amplifier; receive a voltage of a signal line disposed in parallel in the thermistor at another input terminal of the differential amplifier; and amplify a difference between the voltage input to the other input terminal and the voltage input to the one input terminal to output as a control voltage. The output of the differential amplifier is inputted to the one input terminal as feedback via a resistance. The PNP type power transistor includes: an emitter to which the other end of the heater resistance is connected; a base that receives the output of the differential amplifier; and a collector that is grounded. The PNP type current limiting transistor includes: an emitter that receives the supply voltage; a base that receives the voltage between the other end of the heater resistance and the emitter of the power transistor; and a collector connected to the base of the power transistor. The collector of the power transistor and the other end of the thermistor are connected and grounded by a metal pattern that commonly connect. Thus, this allows connecting the ground terminal of the crystal unit and the ground terminals of the power transistor and the thermistor to the common metal pattern so as to conduct efficiently the heat from the power transistor and improves thermal responsiveness and temperature stability. This achieves an oscillator with an excellent temperature characteristic.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. An oven controlled crystal oscillator, comprising:
   a crystal unit;
   a temperature control circuit configured to control a temperature of the crystal unit; and
   a circuit board on which the crystal unit and the temperature control circuit are mounted, wherein
   the crystal unit includes a flange that projects outward to an entire outer periphery in one end, and
   the circuit board includes a depressed portion in which the flange is partially inserted, wherein
   the crystal unit is positioned in a state where the flange is partially inserted in the depressed portion, the crystal unit being connected to a metal pattern,
   wherein the temperature control circuit includes:
   a heater resistance having one end, a supply voltage being supplied to the one end to generate heat;
   a thermistor having one end and another end, the supply voltage being supplied to the one end, the other end being grounded, the thermistor being a temperature sensor with a variable resistance value depending on temperature, the thermistor outputting a voltage corresponding to the temperature to the one end;
   a differential amplifier configured to: receive a voltage between the supply voltage and the one end of the thermistor at one input terminal of the differential amplifier; receive a voltage of a signal line disposed in parallel in the thermistor at another input terminal of the differential amplifier; and amplify a difference between the voltage input to the other input terminal and the voltage input to the one input terminal to output as a control voltage, the output of the differential amplifier being inputted to the one input terminal as feedback via a resistance;
   a PNP type power transistor that includes: an emitter to which the other end of the heater resistance is connected; a base that receives the output of the differential amplifier; and a collector that is grounded; and
   a PNP type current ng transistor that includes: an emitter that receives the supply voltage; a base that receives the voltage between the other end of the heater resistance and the emitter of the power transistor; and a collector connected to the base of the power transistor, wherein
   the collector of the power transistor and the other end of the thermistor are connected and grounded by the metal pattern that commonly connect.

2. The oven controlled crystal oscillator according to claim 1, wherein
   the depressed portion is a slit that passes through the circuit board.

3. The oven controlled crystal oscillator according to claim 1, wherein
   the depressed portion is a groove that does not pass through the circuit board.

4. An oven controlled crystal oscillator, comprising:
   a cylindrical crystal unit;
   a temperature control circuit configured to control a temperature of the crystal unit; and
   a circuit board on which the crystal unit and the temperature control circuit are mounted, wherein
   the crystal unit includes a flange that projects outward to an entire outer periphery on a surface bonded on the circuit board, the flange being connected to a ground terminal of the crystal unit,
   the circuit board includes a depressed portion formed in a part where the crystal unit is mounted and a soldering pattern that connects the crystal unit around the depressed portion,
   the temperature control circuit includes: a power transistor that becomes a heat source; a thermistor as a temperature sensor; and a metal pattern that connects commonly a ground terminal of the crystal unit, a collector of the power transistor, and a ground terminal of the thermistor, and
   the ground terminal of the crystal unit is soldered to the soldering pattern of the circuit board and connected to the metal pattern.

5. The oven controlled crystal oscillator according to claim 1, further comprising:
   a P-channel MOSFET instead of the power transistor.

6. The oven controlled crystal oscillator according to claim 4, wherein
the temperature control circuit includes:
a heater resistance having one end, a supply voltage being supplied to the one end to generate heat;
a thermistor having one end and another end, the supply voltage being supplied to the one end, the other end being grounded, the thermistor being a temperature sensor with a variable resistance value depending on temperature, the thermistor outputting a voltage corresponding to the temperature to the one end;
a differential amplifier configured to: receive a voltage between the supply voltage and the one end of the thermistor at one input terminal of the differential amplifier; receive a voltage of a signal line disposed in parallel in the thermistor at another input terminal of the differential amplifier; and amplify a difference between the voltage input to the other input terminal and the voltage input to the one input terminal to output as a control voltage, the output of the differential amplifier being inputted to the one input terminal as feedback via a resistance;
a PNP type power transistor that includes: an emitter to which the other end of the heater resistance is connected; a base that receives the output of the differential amplifier; and a collector that is grounded; and
a PNP type current limiting transistor that includes: an emitter that receives the supply voltage; a base that receives the voltage between the other end of the heater resistance and the emitter of the power transistor; and a collector connected to the base of the power transistor, wherein
the collector of the power transistor and the other end of the thermistor are connected and grounded by a metal pattern that commonly connect.

* * * * *